US011079407B2

(12) United States Patent
Dandy

(10) Patent No.: US 11,079,407 B2
(45) Date of Patent: Aug. 3, 2021

(54) PROBE ATTENUATOR FOR REDUCED INPUT CAPACITANCE

(71) Applicant: Tektronix, Inc., Beaverton, OR (US)

(72) Inventor: Jonathan S. Dandy, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 396 days.

(21) Appl. No.: 15/842,654

(22) Filed: Dec. 14, 2017

(65) Prior Publication Data

US 2019/0011481 A1 Jan. 10, 2019

Related U.S. Application Data

(60) Provisional application No. 62/530,759, filed on Jul. 10, 2017.

(51) Int. Cl.

| | |
|---|---|
| ***G01R 1/067*** | (2006.01) |
| ***G01R 35/00*** | (2006.01) |
| ***G01R 1/44*** | (2006.01) |

(52) U.S. Cl.

CPC ..... *G01R 1/06766* (2013.01); *G01R 1/06772* (2013.01); *G01R 1/44* (2013.01); *G01R 35/00* (2013.01); *G01R 35/005* (2013.01)

(58) Field of Classification Search

CPC ............ G01R 1/06766; G01R 1/06772; G01R 35/00; G01R 35/005; G01R 1/44

USPC .......................................... 324/76.44, 750.02

See application file for complete search history.

(56) References Cited

U.S. PATENT DOCUMENTS

| | | | | |
|---|---|---|---|---|
| 4,546,321 A * | 10/1985 | Bateman ................ | H03G 7/001 327/334 |
| 4,814,872 A * | 3/1989 | Ivie ........................ | G01R 13/32 348/184 |
| 5,886,581 A * | 3/1999 | Hugel ..................... | H03F 1/303 330/136 |
| 6,836,107 B2 * | 12/2004 | Mende ................. | G01R 15/185 324/117 H |

(Continued)

FOREIGN PATENT DOCUMENTS

| | | |
|---|---|---|
| CN | 103364599 | 10/2013 |
| DE | 2704002 | 8/1978 |

(Continued)

OTHER PUBLICATIONS

European Patent Office, Extended European Search Report and Written Opinion for European Patent Application 18182476.4, dated Nov. 27, 2018, 8 pages, Munich, Germany.

*Primary Examiner* — Farhana A Hoque

(74) *Attorney, Agent, or Firm* — Miller Nash Graham & Dunn; Andrew J. Harrington

(57) ABSTRACT

Disclosed is a test and measurement probe including a signal channel having an input series resistor with a series parasitic capacitance. The probe also includes an amplifier coupled to the signal channel. The amplifier includes a shunt parasitic capacitance. A variable shunt resistor is coupled to the signal channel and a ground. The variable shunt resistor can be set to match a resistance capacitance (RC) value associated with the series parasitic capacitance and the shunt. The probe can also include a variable series resistor coupled to the amplifier. The variable series resistor can be set to adjust for attenuation variation associated with the variable shunt resistor. Other embodiments may be described and/or claimed herein.

19 Claims, 5 Drawing Sheets

(56) References Cited

U.S. PATENT DOCUMENTS

2009/0309605 A1* 12/2009 Prance .................. G01R 29/12 324/457
2011/0074392 A1* 3/2011 Bartlett ............. G01R 1/06766 324/76.44
2011/0115499 A1* 5/2011 Chodavarapu ......... G01R 27/26 324/649
2011/0241713 A1* 10/2011 Duarte De Martin ...................... G01R 31/2884 324/755.01

FOREIGN PATENT DOCUMENTS

JP H06331657 12/1994
JP 2009145172 7/2009
JP 2010121956 6/2010

* cited by examiner

PROBE ATTENUATOR FOR REDUCED INPUT CAPACITANCE

CROSS-REFERENCES TO RELATED APPLICATIONS

The present application claims benefit from U.S. Provisional Patent Application Ser. No. 62/530,759, filed Jul. 10, 2017, and entitled "Probe Attenuator For Reduced Input Capacitance," which is incorporated herein by reference as if reproduced in its entirety.

FIELD OF THE INVENTION

This disclosure is directed to mechanisms associated with aspects of a test and measurement probe, and, more particularly, to mechanisms to reduce capacitance in a test and measurement probe.

BACKGROUND

Test and measurement systems are designed to receive and measure test signals, for example from a Device Under Test (DUT). For example, a test and measurement system, such as an oscilloscope, may couple to a DUT via a probe. In order to measure a test signal from the DUT, an electrical current is drawn from the DUT across the probe. Drawing current from the DUT may change the electrical characteristics of the circuit being tested. Hence, an ideal probe should draw the smallest amount of current possible. Current drawn by the measurement device is referred to as signal loading. Signal loading is undesirable, because signal loading may alter the function of the DUT and/or provide inaccurate test data. Signal loading is a function of impedance, which is in turn a function of resistance and capacitance in the probe. Increased probe resistance increases impedance, and hence signal loading, for direct current (DC) and low frequency signals. Decreased probe capacitance increases impedance, and hence signal loading, for high frequency signals. As such, the resistance and the capacitance of the signal probe directly affect the range of signals that can be measured by the probe without introducing unacceptable levels of signal loading. In particular, progressively reduced signal probe capacitance allows for accurate measurement progressively higher frequency signals.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
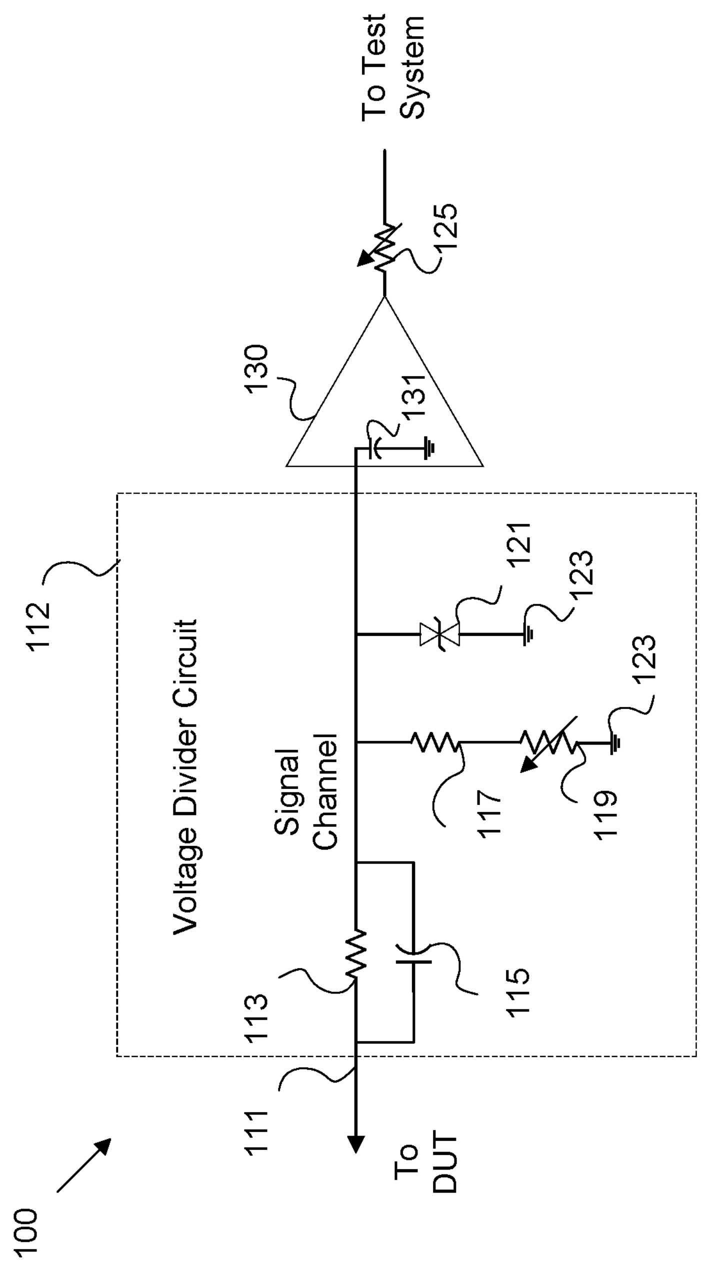
FIG. 1 is a schematic diagram of an example signal probe for reduced input capacitance.

Some signal probes employ a voltage divider circuit and an amplifier to mitigate signal loading at lower frequencies. However, the voltage divider circuit and the amplifier include parasitic capacitances. Such parasitic capacitances may vary based on temperature and based on test setup. The signal probes may employ a variable shunt capacitor, where shunt indicates a component that couples from a signal channel to ground. The variable shunt capacitor is employed to match a Resistance Capacitance (RC) value of the voltage divider circuit with an RC value of the probe input and amplifier. This results in overcoming an unknown capacitance with a controlled calibrated capacitance, which then results in a consistent signal response over a specified frequency range. Unfortunately, adding the variable shunt capacitor increases the capacitance of the signal probe, and hence increases undesirable signal loading at higher frequencies.

This disclosure seeks to lower the input capacitance of the probe by freeing the capacitive divider from having to match any pre-selected attenuation. Instead, the capacitive divider created by parasitic capacitance across the series resistor and the amplifier shunt capacitance is matched by adjusting the value of the shunt resistor. The shunt resistance variation can either be realized by a potentiometer (e.g. up to perhaps 2 GHz), a laser-trimmable resistor, by measuring the capacitive attenuation and installing the desired value of resistor in the probe, or in any other suitable manner. The attenuation in front of the amplifier varies as these capacitances change from probe to probe, but the response can be set flat by adjusting the resistive attenuation to match. To calibrate the overall probe gain, a small adjustable attenuation correction may then be built in to the output series termination of the amplifier. The amplifier input capacitance still varies with input voltage and temperature. In order to correct for these variation to a first order, compensating components can be added with as little increase to the shunt capacitance as possible. For example, for a junction gate field-effect transistor (JFET) amplifier, an input capacitance may be changed approximately 1 femtofarad (fF) per degree Celsius (C) over the expected operating temperature range. An electrostatic sensitive device (ESD) diode with a nearly equal and opposite temperature coefficient of capacitance may be included while only increasing the shunt capacitance by about 200 fF. As an added benefit, the op-amp acting as an attenuator is further protected from ESD spikes that may occur at probe inputs. Similarly, the input voltage capacitance changes can be compensated from an appropriately biased varactor to flatten the shunt capacitance to within expected levels for probe performance. There is also the option of biasing a varactor with a voltage that is temperature-dependent in the event that temperature coefficients do not otherwise sum to nearly zero.

In other words, disclosed herein is a probe design that reduces signal probe capacitance, resulting in reduced impedance, reduced signal loading, and increased accuracy at higher frequencies (e.g. up to about two gigahertz (GHz)). Specifically, the variable shunt capacitor is omitted from the voltage divider circuit. This omission reduces impedance effects at higher frequencies according to the reduction in capacitance by such omission. The signal probe includes a variable shunt resistor, which is employed to match the RC value of the divider circuit with the RC value of the amplifier and the signal probe input. Matching the RC value with a variable shunt resistor alters the attenuation characteristics of the voltage divider circuit. Hence, a variable series resistor is also included along the signal path. Once the variable shunt resistor is tuned to provide a flat frequency response, the variable series resistor is employed to adjust for attenuation variation caused by the variable shunt resistor. Further, a shunt ESD diode may be employed in the voltage divider circuit. The ESD diode protects the amplifier from electrostatic discharge. The ESD diode and the amplifier both include capacitances that vary according to temperature. However, the temperature coefficient of capacitance of the ESD diode is nearly equal and opposite to the temperature coefficient of capacitance of the amplifier. As such, the shunted ESD diode reduces and may nearly eliminate temperature related capacitance variation. In an example, the temperature related capacitance variation is limited to a change of about twenty femtofarads (fF) over an eighty degree Celsius (c) temperature change. Such temperature related capacitance changes can be further mitigated by employing a shunt diode in the voltage divider circuit. The shunt diode may be biased to mitigate support matching the RC value of the voltage divider circuit to the RC value of the amplifier at a specified temperature. In yet another example, a temperature sensor and corresponding conditioning circuitry can control the bias to the shunt diode. This allows the RC match to actively adjust based on temperature, and hence compensate for temperature related capacitance variation in the amplifier.

FIG. 1 is a schematic diagram of an example signal probe 100 for reduced input capacitance. The signal probe 100 may also be referred to as a test and measurement probe. The signal probe 100 includes a voltage divider circuit 112, an amplifier 130, and a variable series resistor 125 coupled together via a signal channel 111 for transporting a test signal from a DUT to a test system. The voltage divider 112 and amplifier 130 provide impedance to limit signal loading. As noted above, excessive current drawn across the signal channel 111 can alter the electrical characteristics of the DUT, and hence provide an inaccurate test signal in a process referred to as signal loading.

The voltage divider 112 includes an input series resistor 113 in the signal channel 111. The voltage divider 112 also includes a static shunt resistor 117 and a variable shunt resistor 119. It should be noted that the static shunt resistor 117 and variable shunt resistor 119 may be combined into a signal resistive element in some examples. The static shunt resistor 117 and variable shunt resistor 119 are considered shunt components because the signal channel 111 is coupled to a ground 123 (e.g. shunted) via the static shunt resistor 117 and variable shunt resistor 119. The voltage divider 112 is a passive linear circuit that provides an output voltage that is a fraction of an input voltage. From a DC perspective, the fraction is determined by the value of the input series resistor 113 relative to the values of the shunt resistors 117 and 119. Hence, the shunt resistors 117 and 119 and the input series resistor 113 act as the voltage divider circuit 112. In other words, the input series resistor 113, static shunt resistor 117, and variable shunt resistor 119 provide resistive impedance, which mitigates signal loading. The variable shunt resistor 119 may be implemented by a trimmer potentiometer, a laser trimmed resistor, and/or a resistor selected to employ a specified resistance that results in a matched RC value, depending on the example. It will be appreciated that these are merely meant to be illustrative examples of possible variable shunt resistor configurations and that other configurations for employing the variable shunt resistor will be readily apparent to a person of ordinary skill in the art.

The amplifier 130 provides a high-impedance input and a low-impedance output. As such, the input of amplifier 130 has a higher impedance than the output of amplifier 130. The input of the amplifier 130 is coupled to the voltage divider circuit 112 via the signal channel 111. The high-impedance input of amplifier 130 keeps the flow of charge from the DUT as low as possible, while allowing a measurable amount of charge to pass, and thus reduces signal loading. The low-impedance output is employed to drive a cable (e.g. a fifty-ohm cable) and test equipment.

In addition to resistive impedance, the voltage divider circuit 112 and amplifier 130 also create capacitance, which acts as part of the signal probe's 100 impedance. The input series resistor 113 included in the signal channel 111 creates a series parasitic capacitance 115. The amplifier 130 coupled to the signal channel 111 includes a shunt parasitic capacitance 131. The capacitance provided by the series parasitic capacitance 115 and shunt parasitic capacitance 131 may vary based on temperature, test circuit components, etc., but may be about 0.22 picofarads (pF) and 1.8 pF, respectively. The parasitic capacitances 115 and 131 cause test signal variation at different frequencies. Such variation may result in an altered test signal, and hence inaccurate test results. In other words, due to the parasitic capacitances 115 and 131, the DC/low frequency gain of the circuit may be different from the high frequency gain of the circuit. Such differences in gain may then be erroneously measured as part of the test signal.

Accordingly, the variable shunt resistor 119, which is coupled to the signal channel 111 and the ground 123, may be adjusted so that the series RC time constant created by series resistor 113 and series parasitic capacitance 115 matches the shunt RC time constant created by shunt resistors 117 and 119 and the parasitic capacitance 131. In other words, the static shunt resistor 117 and the variable shunt resistor 119 together with the amplifier 130 shunt parasitic capacitance 131 provide a resistance and a parasitic capacitance, which results in an RC value. By adjusting the variable shunt resistor 119, the RC time constant value of the shunt portion of the circuit can be matched to the RC time constant value of input series resistor 113 and the series parasitic capacitance 115. By matching the RC values of the shunt portion of the circuit and the signal channel 111 portion of the circuit, the DC/low frequency gain of the test signal matches the high frequency gain of the test signal. When this occurs, a test signal forwarded over the signal channel 111 appears substantially flat when graphed in the frequency domain. Hence the signal probe 100, when calibrated via the variable shunt resistor 119, reproduces the shape of the test signal at the output of amplifier 130.

As noted above, such RC matching could be accomplished by employing a variable shunt capacitor in the voltage divider circuit 112. However, employing a variable shunt capacitor increases the overall capacitance of the circuit, and hence increases signal loading. Accordingly, the voltage divider circuit 112 of the signal probe 100 accomplishes the RC matching independent of (i.e. without employing) a shunt capacitor. In other words, the signal probe 100 applies a loading capacitance to the DUT via the signal channel 111 due to the capacitances inherent in the circuit. However, the loading capacitance is reduced by omitting the shunt capacitor from the voltage divider circuit 112.

It should be noted that, by performing RC matching via variable shunt resistor 119 instead of a variable capacitor, the amplitude of test signal across the signal channel 111 is allowed to vary. In order to account for this amplitude variation, the signal probe 100 includes the variable series resistor 125 coupled to the output of the amplifier 130. The variable series resistor 125 may be set to adjust for attenuation variation associated with the variable shunt resistor 119. This overcomes the signal attenuation concerns associated with variable shunt resistor 119 based RC matching without employing a shunt capacitor.

In some examples, the voltage divider circuit 112 of the signal probe 100 also includes a shunt electrostatic sensitive device (ESD) diode 121. The shunt ESD diode 121 is coupled to the signal channel 111 and the ground 123. The shunt ESD diode 121 is designed to allow charge to flow toward the ground 123 when excess charge is forwarded across the signal channel 111. This may occur in cases of electrostatic discharge, and may result in damage to electronic equipment. Accordingly, the shunt ESD diode 121 protects the amplifier 130, and other components along the signal channel 111, from electrostatic discharge forwarded across the signal channel 111. The shunt ESD diode 121 may also support other functionality. For example, the parasitic capacitance 131 of the amplifier 130 varies based on ambient temperature. The shunt ESD diode 121 applies a parasitic capacitance that also varies based on ambient temperature, but in the opposite direction. Hence, the temperature varying capacitance of the shunt ESD diode 121 offsets/mitigates the temperature varying capacitance associated with the shunt parasitic capacitance 131 of the amplifier 130.

It should be noted that the signal probe 100 may be implemented in several components. For example, the signal probe 100 may include a probe tip, coupled to a compensation box via a cable and a controller coupled to the compensation box. In some examples, the voltage divider circuit 112 is positioned in the probe tip and amplifier 130 and variable series resistor 125 are positioned in the compensation box and/or controller. However, the components of signal probe 100, as depicted, may also be mounted completely in the probe tip in some examples.

Figure 2:
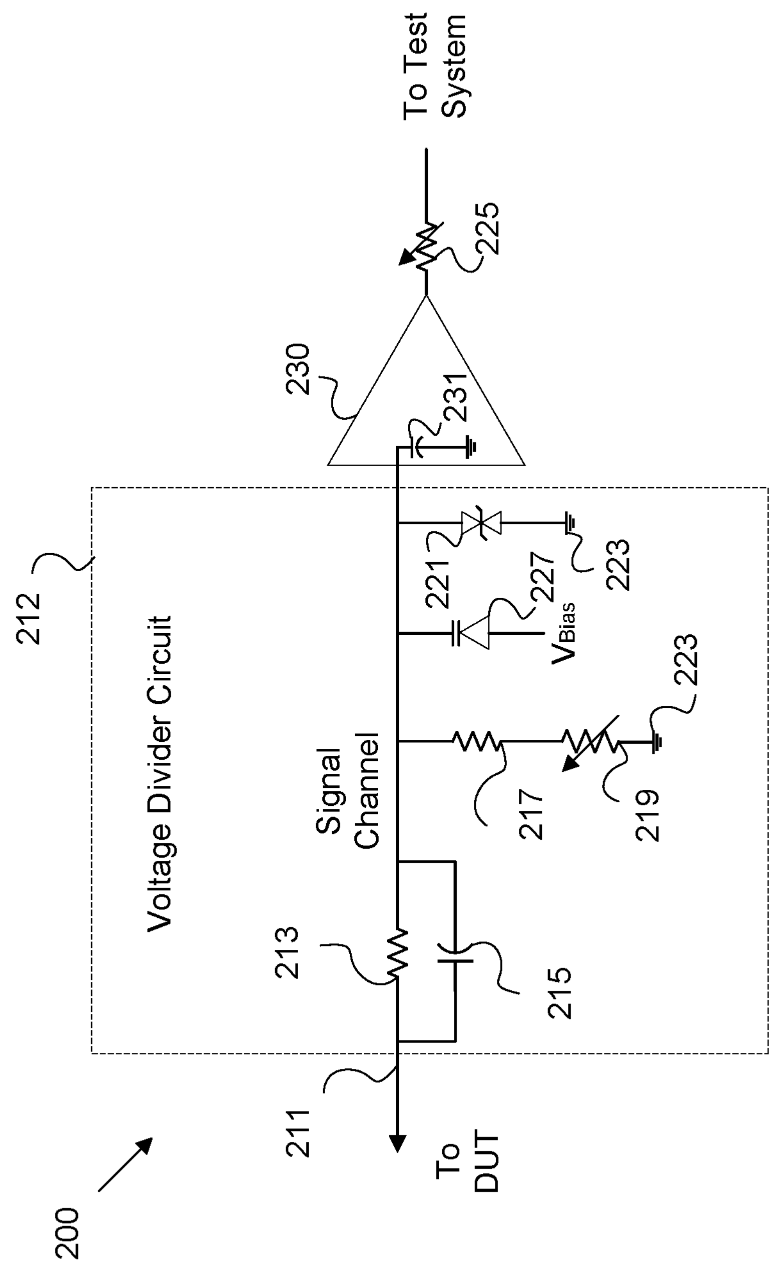
FIG. 2 is a schematic diagram of an example signal probe for reduced input capacitance with fixed temperature correction.

FIG. 2 is a schematic diagram of an example signal probe 200 for reduced input capacitance with fixed temperature correction. The signal probe 200 is similar to signal probe 100 with additional temperature correction. Signal probe 200 includes a signal path 211, a voltage divider circuit 212, an input series resistor 213, a series parasitic capacitance 215, a static shunt resistor 217, a variable shunt resistor 219, a ground 223, a shunt ESD diode 221, an amplifier 230, a shunt parasitic capacitance 231, and a variable series resistor 225, which are substantially similar to the signal path 111, voltage divider circuit 112, input series resistor 113, series parasitic capacitance 115, static shunt resistor 117, variable shunt resistor 119, ground 123, shunt ESD diode 121, amplifier 130, shunt parasitic capacitance 131, and variable series resistor 125, respectively.

The signal probe 200 voltage divider circuit 212 also includes a shunt diode 227. The shunt diode 227 is coupled to the signal channel 211 as shown (e.g. and/or to a ground). The shunt diode 227 is biased via a negative tuning bias voltage (vBias), for example from a voltage source. The biased shunt diode 227 supports matching the RC value associated with the series parasitic capacitance 215 and the shunt parasitic capacitance 231 by altering the shunted capacitance. For example, the shunt diode 227 may apply capacitance on the order of femtofarads (fF), and may be employed to tune the RC constant of the voltage divider circuit 212 to correct for capacitance changes due to system temperature. In some examples, the shunt diode 227 is implemented as a biased varactor diode. It should be noted that, in some examples, the shunt diode 227 may be inverted from the orientation shown in FIG. 2. In such cases, an anode of the shunt diode 227 is connected to the signal bias and the cathode is connected to the signal channel 211. In such a case, the polarity of the shunt diode 227 is inverted, and hence the polarity of the signal bias is also inverted.

Figure 3:
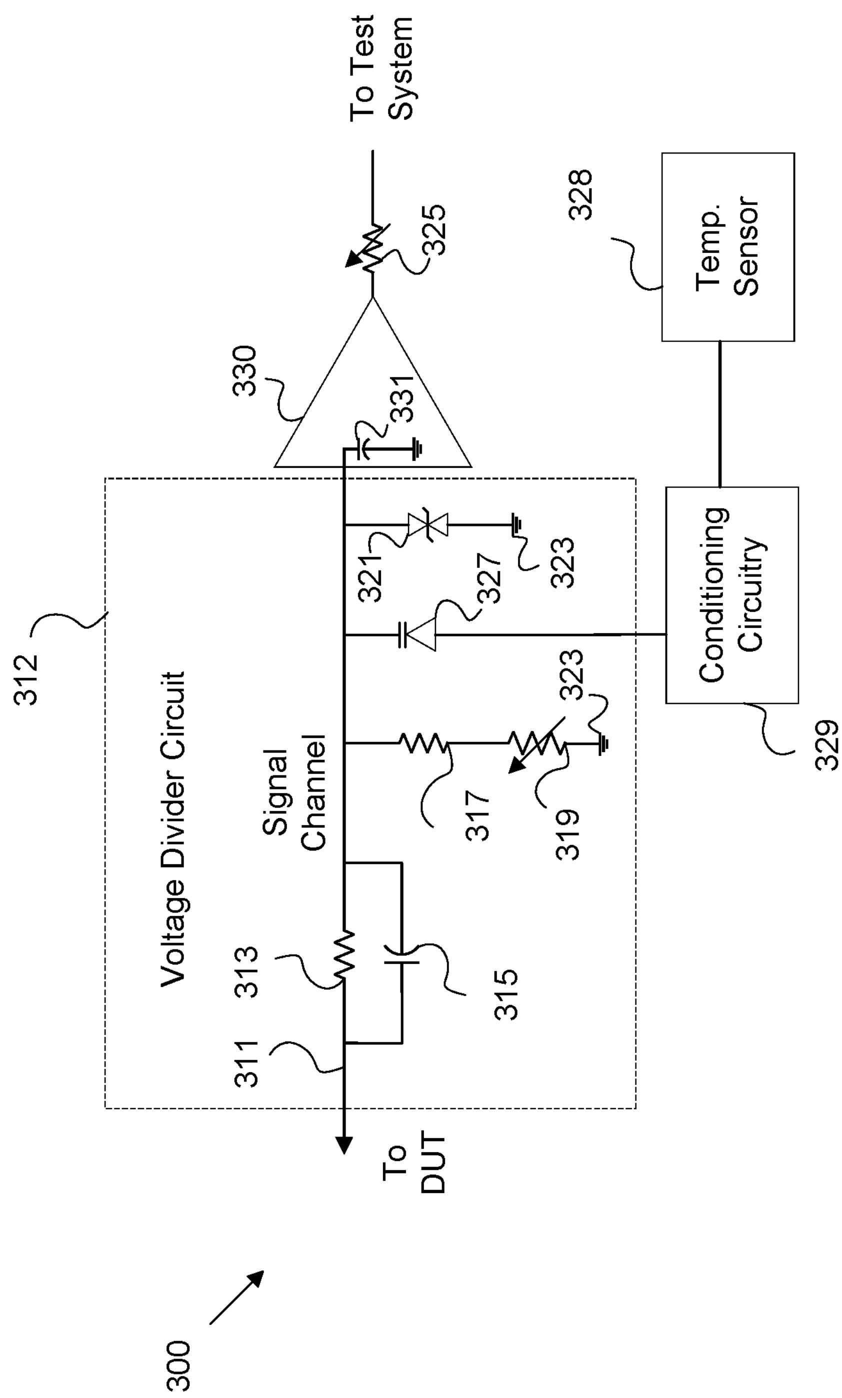
FIG. 3 is a schematic diagram of an example signal probe for reduced input capacitance with temperature correction based on a measured temperature.

FIG. 3 is a schematic diagram of an example signal probe 300 for reduced input capacitance with temperature correction based on a measured temperature. The signal probe 300 is similar to signal probe 200 with active temperature correction. Signal probe 300 includes a signal path 311, a voltage divider circuit 312, an input series resistor 313, a series parasitic capacitance 315, a static shunt resistor 317, a variable shunt resistor 319, a ground 323, a shunt diode 327, a shunt ESD diode 321, an amplifier 330, a shunt parasitic capacitance 331, and a variable series resistor 325, which are substantially similar to the signal path 211, voltage divider circuit 212, input series resistor 213, series parasitic capacitance 215, static shunt resistor 217, variable shunt resistor 219, ground 223, shunt diode 227, shunt ESD diode 221, amplifier 230, shunt parasitic capacitance 231, and variable series resistor 225, respectively.

The signal probe 300 also includes a temperature sensor 328, which is any device configured to measure temperature. The signal probe 300 also includes a conditioning circuit 329 coupled to the temperature sensor 328 and the shunt diode 327 as shown. The conditioning circuit 329 is any component or group of components configured to bias the shunt diode 327 based on temperature measured by the temperature sensor 328. Accordingly, the conditioning circuit 329 applies a negative temperature dependent voltage to the shunt diode 327 to correct for changes in capacitance related to temperature changes.

Figure 4:
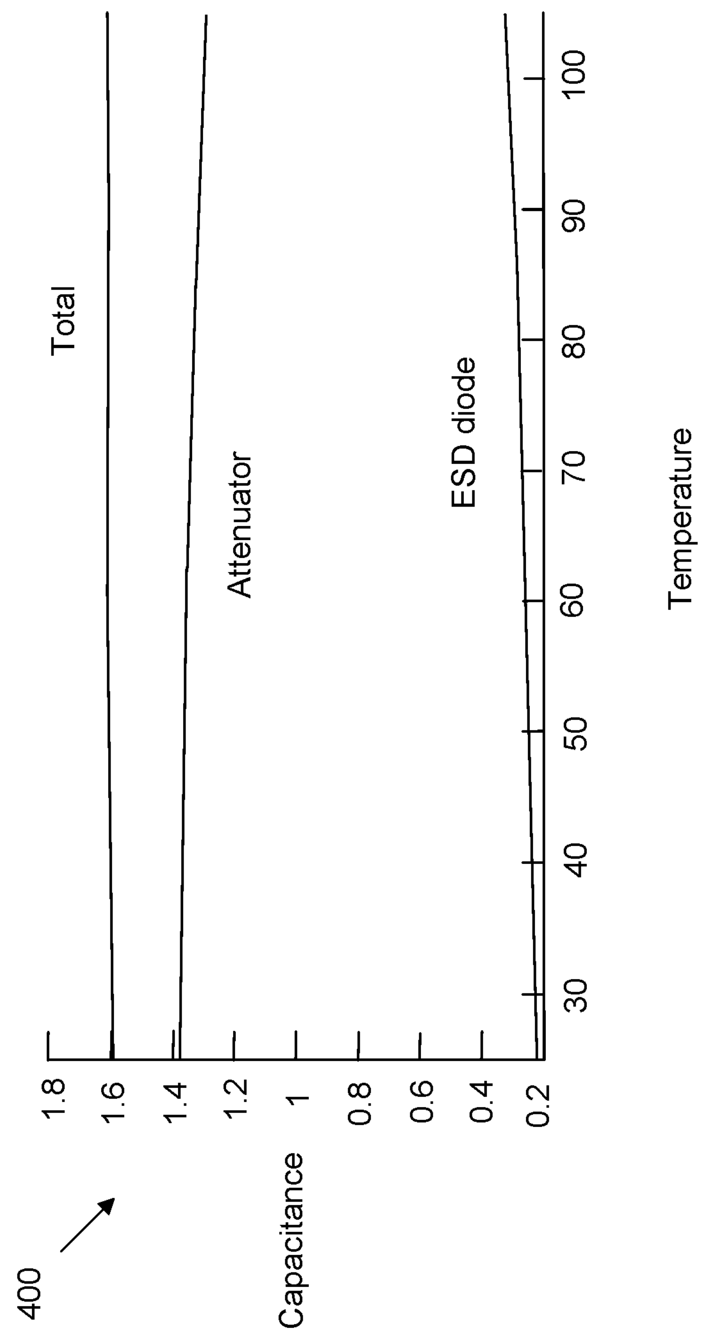
FIG. 4 is a graph of temperature related capacitance compensation for an example signal probe.

FIG. 4 is a graph 400 of temperature related capacitance compensation for an example signal probe, such as signal probe 100, 200, and/or 300. Graph 400 shows changes in example amplifier capacitance, ESD diode capacitance, and total capacitance as a function of temperature. The temperature is shown in Celsius (C) and the capacitance is shown in pF. As shown, the ESD diode increases capacitance by about 102 fF from 30 degrees C. to 100 degrees C. Over the same range, the amplifier capacitance decreases about 82 fF. As these changes are complementary, the resulting temperature change over the entire circuit is about 20 fF over the same range, which is negligible. Accordingly, the inverse relationship in temperature changing capacitance between the amplifier and the ESD diode largely mitigates the effects of temperature on RC matching in an example signal probe such as signal probes 100, 200, and/or 300. Further, is additional accuracy is desired, a biased shunt diode, such as diode 227 and/or 327, can be employed to further correct for ambient temperature changes.

Figure 5:
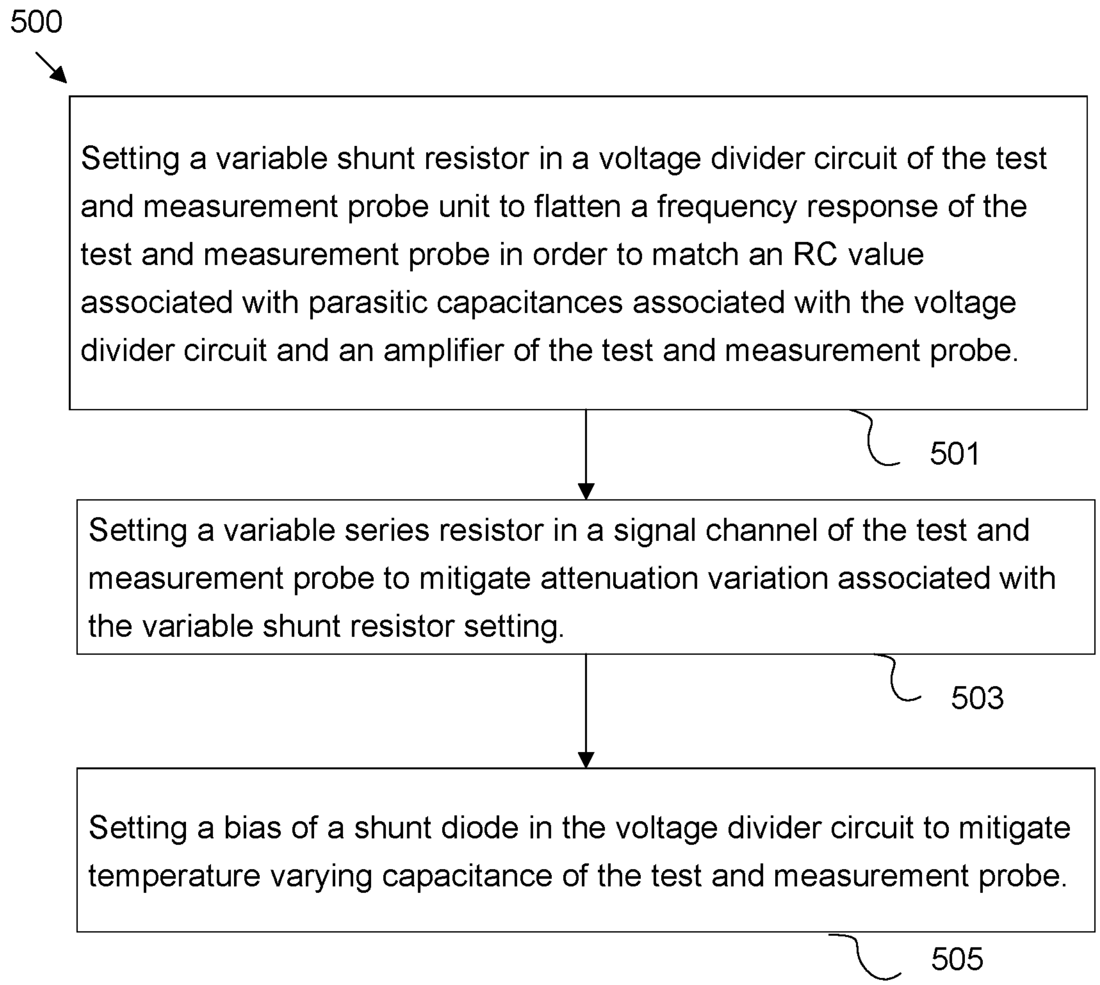
FIG. 5 is a flowchart of an example method of calibrating a test and measurement probe.

FIG. 5 is a flowchart of an example method 500 of calibrating a test and measurement probe, such as signal probe 100, 200, and/or 300. At block 501, a variable shunt resistor, such as variable shunt resistor 119, 219, and/or 319 is set. As noted above, the variable shunt resistor is employed in a voltage divider circuit of the test and measurement probe. The variable shunt resistor is adjusted and set to match the RC value of the shunt with the RC value of the series path. A known test signal of constant amplitude and varying frequency may be forwarded across the signal channel for calibration purposes. When the test signal is graphed on an oscilloscope in the frequency domain, the resulting waveform appears to have different amplitude values at different frequencies when the RC values do not match. Accordingly, the variable shunt resistor may be adjusted until the graph shows a flat response in the frequency domain. The flattened frequency response of the test and measurement probe indicates that the RC values are matched and hence the probe applies a consistent level of attenuation across the frequencies of interest. As such, flattening the frequency response of the test and measurement probe results in matching the RC time constants associated with the series elements and shunt elements. Also as noted above, a shunt capacitor is omitted from the voltage divider circuit to reduce the capacitance of the probe. Hence, setting the variable shunt resistor to flatten the frequency response of the test and measurement probe does not include adjusting a variable capacitor.

Setting the variable shunt resistor in block 501 also adjusts the attenuation of the circuit. A probe is expected to provide a specified attenuation, and hence setting the variable shunt resistor results in deviations from the expected attenuation. Such deviations may be unknown prior to setting the probe and may vary from probe to probe. Block 503 is employed to compensate for such attenuation changes and to provide a consistent attenuation across a product line of test and measurement probes. At block 503, a variable series resistor in the signal channel of the test and measurement probe is set. For example, the test signal for calibration has a known amplitude. Hence, the variable series resistor can be adjusted until the frequency response shown on the oscilloscope displays at an amplitude associated with a desired attenuation. For example, when a probe is expected to have a ten times (10X) attenuation and the test signal is a ten volt signal, the variable series resistor can be adjusted until the frequency response indicates an amplitude of one volt. By performing block 503, the attenuation variation associated with the variable shunt resistor setting is mitigated.

Optionally, block 505 may be performed to mitigate temperature based capacitance variations. As noted above, the voltage divider circuit may include a shunt ESD diode with a temperature varying capacitance that offsets a temperature varying capacitance associated with an amplifier of the test and measurement probe. Block 505 may be performed in addition to use of the ESD diode. At block 505, a bias of a shunt diode in the voltage divider circuit may be set to mitigate temperature varying capacitance of the test and measurement probe. In some cases, the shunt diode may be operated by a temperature sensor and conditioning circuity. In such cases, setting the shunt diode may include initializing the temperature sensor and conditioning circuity.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a test and measurement probe comprising: a voltage divider circuit including a variable shunt resistor; an amplifier with an input coupled to the voltage divider circuit and an output; and a variable series resistor coupled to the output of the amplifier.

Example 2 includes the test and measurement probe of Example 1, wherein the voltage divider circuit does not include a shunt capacitor.

Example 3 includes the test and measurement probe of any of Examples 1-2, wherein the voltage divider circuit includes a shunt electrostatic sensitive device (ESD) diode.

Example 4 includes the test and measurement probe of any of Examples 1-3, wherein the voltage divider circuit includes a shunt diode.

Example 5 includes the test and measurement probe of Example 4, wherein the shunt diode is a biased varactor diode.

Example 6 includes the test and measurement probe of any of Examples 4-5, further comprising: a temperature sensor; and a conditioning circuit coupled to the temperature sensor and the shunt diode, the conditioning circuit configured to bias the shunt diode based on temperature.

Example 7 includes a test and measurement probe comprising: a signal channel including an input series resistor with a series parasitic capacitance; an amplifier coupled to the signal channel, the amplifier with a shunt parasitic capacitance; a variable shunt resistor coupled to the signal channel and a ground, the variable shunt resistor set to reduce a voltage across the signal channel and match a resistance capacitance (RC) value associated with the series parasitic capacitance and input series resistor and the shunt parasitic capacitance and variable shunt resistor; and a variable series resistor coupled to the amplifier, the variable series resistor set to adjust for attenuation variation associated with the variable shunt resistor.

Example 8 includes the test and measurement probe of Example 7, wherein the variable shunt resistor and the input series resistor act as a voltage divider circuit, and the voltage divider circuit does not include a shunt capacitor.

Example 9 includes the test and measurement probe of Example 8, wherein the test and measurement probe applies a loading capacitance to a Device Under Test (DUT) via the signal channel, and wherein the loading capacitance is reduced by omission of the shunt capacitor from the voltage divider circuit.

Example 10 includes the test and measurement probe of any of Examples 7-9, further comprising a shunt electrostatic sensitive device (ESD) diode coupled to the signal channel, the ESD diode to protect the amplifier from electrostatic discharge across the signal channel.

Example 11 includes the test and measurement probe of Example 10, wherein the ESD diode includes a temperature varying capacitance that offsets a temperature varying capacitance associated with the shunt parasitic capacitance of the amplifier.

Example 12 includes the test and measurement probe of any of Examples 7-11, further comprising a shunt diode coupled to the signal channel and the ground, the shunt diode biased to support matching the RC value associated with the series parasitic capacitance and the shunt parasitic capacitance.

Example 13 includes the test and measurement probe of Example 12, wherein the shunt diode is a varactor diode.

Example 14 includes the test and measurement probe of any of Examples 12-13, further comprising: a temperature sensor to measure temperature; and a conditioning circuit coupled to the temperature sensor and the shunt diode, the conditioning circuit configured to bias the shunt diode based on the temperature.

Example 15 includes a method of calibrating a test and measurement probe comprising: setting a variable shunt resistor in a voltage divider circuit of the test and measurement probe to flatten a frequency response of the test and measurement probe; and setting a variable series resistor in a signal channel of the test and measurement probe to mitigate attenuation variation associated with the variable shunt resistor setting.

Example 16 includes the method of Example 15, wherein flattening the frequency response of the test and measurement probe results in matching a resistance capacitance (RC) value associated with resistance and parasitic capacitances associated with the voltage divider circuit and an amplifier of the test and measurement probe.

Example 17 includes the method of any of Examples 15-16, further comprising setting a bias of a shunt diode in the voltage divider circuit to mitigate temperature varying capacitance of the test and measurement probe.

Example 18 includes the method of any of Examples 15-17, wherein setting the variable shunt resistor to flatten the frequency response of the test and measurement probe does not include adjusting a variable capacitor.

Example 19 includes the method of any of Examples 15-18, wherein the voltage divider circuit does not include a shunt capacitor.

Example 20 includes the method of any of Examples 15-19, wherein the voltage divider circuit includes a shunt electrostatic sensitive device (ESD) diode with a temperature varying capacitance that offsets a temperature varying capacitance associated with an amplifier of the test and measurement probe.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

I claim:

1. A test and measurement probe comprising:

a signal input configured to receive a test signal;

a variable series resistor coupled to an input of a test system;

a signal amplifier within the probe having a signal output coupled to the variable series resistor; and a voltage divider circuit coupled between the signal input and the signal amplifier through a signal channel, the voltage divider circuit including a signal channel portion having an RC time constant and a shunt portion having an RC time constant, the shunt portion including a variable shunt resistor, wherein the resistance of the variable shunt resistor is selected so that the RC time constant of the shunt portion of the voltage divider circuit matches the RC time constant of the signal channel portion of the voltage divider circuit.

2. The test and measurement probe of claim 1, wherein the voltage divider circuit does not include a shunt capacitor.

3. The test and measurement probe of claim 1, wherein the voltage divider circuit includes a shunt electrostatic sensitive device (ESD) diode.

4. The test and measurement probe of claim 1, wherein the voltage divider circuit includes a shunt diode.

5. The test and measurement probe of claim 4, wherein the shunt diode is a biased varactor diode.

6. The test and measurement probe of claim 4, further comprising:

a temperature sensor; and a conditioning circuit coupled to the temperature sensor and the shunt diode, the conditioning circuit configured to bias the shunt diode based on temperature.

7. A test and measurement probe comprising:

a signal channel including an input series resistor with a series parasitic capacitance;

an amplifier within the probe coupled between the signal channel and an output of the probe, the amplifier including a shunt parasitic capacitance;

a variable shunt resistor coupled between the signal channel and a ground, the variable shunt resistor set to reduce a voltage across the signal channel and match a resistance capacitance (RC) value associated with the series parasitic capacitance and input series resistor and the shunt parasitic capacitance and variable shunt resistor; and a variable series resistor coupled between the output of the amplifier and the output of the probe, the variable series resistor set to adjust for attenuation variation associated with the variable shunt resistor.

8. The test and measurement probe of claim 7, wherein the variable shunt resistor and the input series resistor act as a voltage divider circuit, and the voltage divider circuit does not include a shunt capacitor.

9. The test and measurement probe of claim 8, wherein the test and measurement probe applies a loading capacitance to a Device Under Test (DUT) via the signal channel, and wherein the loading capacitance is reduced by omission of the shunt capacitor from the voltage divider circuit.

10. The test and measurement probe of claim 7, further comprising a shunt electrostatic sensitive device (ESD) diode coupled to the signal channel, the ESD diode to protect the amplifier from electrostatic discharge across the signal channel.

11. The test and measurement probe of claim 10, wherein the ESD diode includes a temperature varying capacitance that offsets a temperature varying capacitance associated with the shunt parasitic capacitance of the amplifier.

12. The test and measurement probe of claim 7, further comprising a shunt diode coupled to the signal channel and the ground, the shunt diode biased to support matching the RC value associated with the series parasitic capacitance and the shunt parasitic capacitance.

13. The test and measurement probe of claim 12, wherein the shunt diode is a varactor diode.

14. The test and measurement probe of claim 12, further comprising:

a temperature sensor to measure temperature; and a conditioning circuit coupled to the temperature sensor and the shunt diode, the conditioning circuit configured to bias the shunt diode based on the temperature.

15. A method of calibrating a test and measurement probe comprising:

setting a variable shunt resistor in a voltage divider circuit of the test and measurement probe to flatten a frequency response of the test and measurement probe; and setting a variable series resistor in a signal channel of the test and measurement probe to mitigate attenuation variation associated with the variable shunt resistor setting, wherein flattening the frequency response of the test and measurement probe results in matching a resistance capacitance (RC) value associated with resistance and parasitic capacitances associated with the voltage divider circuit and an amplifier of the test and measurement probe.

16. The method of claim 15, further comprising setting a bias of a shunt diode in the voltage divider circuit to mitigate temperature varying capacitance of the test and measurement probe.

17. The method of claim 15, wherein setting the variable shunt resistor to flatten the frequency response of the test and measurement probe does not include adjusting a variable capacitor.

18. The method of claim 15, wherein the voltage divider circuit does not include a shunt capacitor.

19. The method of claim 15, wherein the voltage divider circuit includes a shunt electrostatic sensitive device (ESD) diode with a temperature varying capacitance that offsets a temperature varying capacitance associated with an amplifier of the test and measurement probe.

* * * * *